United States Patent
Kannou et al.

(10) Patent No.: US 10,741,711 B2
(45) Date of Patent: Aug. 11, 2020

(54) SOLAR CELL MODULE INCLUDING PLURALITY OF SOLAR CELLS

(71) Applicant: Panasonic Intellectual Property Management Co., Ltd., Osaka (JP)

(72) Inventors: Hiroyuki Kannou, Osaka (JP); Masanori Maeda, Shiga (JP); Keisuke Ogawa, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 6 days.

(21) Appl. No.: 15/627,295

(22) Filed: Jun. 19, 2017

(65) Prior Publication Data

US 2017/0288077 A1    Oct. 5, 2017

Related U.S. Application Data

(63) Continuation of application No. PCT/JP2015/006234, filed on Dec. 15, 2015.

(30) Foreign Application Priority Data

Dec. 26, 2014  (JP) .................................. 2014-265302

(51) Int. Cl.
*H01L 31/048* (2014.01)
*H01L 31/042* (2014.01)
(Continued)

(52) U.S. Cl.
CPC .......... *H01L 31/048* (2013.01); *H01L 31/042* (2013.01); *H01L 31/05* (2013.01);
(Continued)

(58) Field of Classification Search
CPC ..... H01L 31/048; H01L 31/056; H01L 31/05; H01L 31/0504; H01L 31/0508; H01L 31/0512; H01L 31/0516; H02S 40/22
See application file for complete search history.

(56) References Cited

U.S. PATENT DOCUMENTS

2005/0241692 A1* 11/2005 Rubin ............. H01L 31/022425
136/256
2009/0250109 A1* 10/2009 Hasegawa ............. C08K 5/1515
136/256
(Continued)

FOREIGN PATENT DOCUMENTS

JP    2003-324211 A    11/2003
JP    2009-188124 A    8/2009
(Continued)

OTHER PUBLICATIONS

English machine translation of JP 2014-183289. (Year: 2014).*
Search Report issued in corresponding International Patent Application No. PCT/JP2015/006234, dated Feb. 16, 2016.

*Primary Examiner* — Lindsey A Bernier
(74) *Attorney, Agent, or Firm* — McDermott Will & Emery LLP

(57) ABSTRACT

A plurality of solar cells are sealed by an encapsulant between a first protective member and a second protective member. A fixing member fixes, among the plurality of solar cells, a first solar cell and a second solar cell that are adjacent to each other. The fixing member includes a release surface and a non-release surface that are oriented in opposite directions. The non-release surface has disposed thereon a first bonding region and a second bonding region that have adhesive strength, and a non-bonding region different from the first bonding region and the second bonding region.

16 Claims, 12 Drawing Sheets

(51) Int. Cl.
*H01L 31/05* (2014.01)
*H02S 40/22* (2014.01)
*H01L 31/056* (2014.01)

(52) U.S. Cl.
CPC ........ *H01L 31/0504* (2013.01); *H01L 31/056* (2014.12); *H01L 31/0508* (2013.01); *H02S 40/22* (2014.12); *Y02E 10/52* (2013.01)

(56) References Cited

U.S. PATENT DOCUMENTS

| | | | |
|---|---|---|---|
| 2010/0065212 A1* | 3/2010 | Husemann | C09J 7/245 156/332 |
| 2010/0243027 A1 | 9/2010 | Tsujimoto et al. | |
| 2013/0081675 A1* | 4/2013 | Joe | H01L 31/022441 136/251 |
| 2013/0340804 A1* | 12/2013 | Moon | H01L 31/0516 136/244 |
| 2015/0040961 A1* | 2/2015 | Ishii | H01L 31/05 136/244 |

FOREIGN PATENT DOCUMENTS

| | | | | |
|---|---|---|---|---|
| JP | 2010-232558 A | 10/2010 | | |
| JP | 2012-038778 A | 2/2012 | | |
| JP | 2014-183289 A | 9/2014 | | |
| WO | 95/15582 A1 | 6/1995 | | |
| WO | WO-2013116559 A1 * | 8/2013 | ............... | C09K 9/02 |
| WO | WO-2013161810 A1 * | 10/2013 | ......... | H01L 31/0508 |

\* cited by examiner

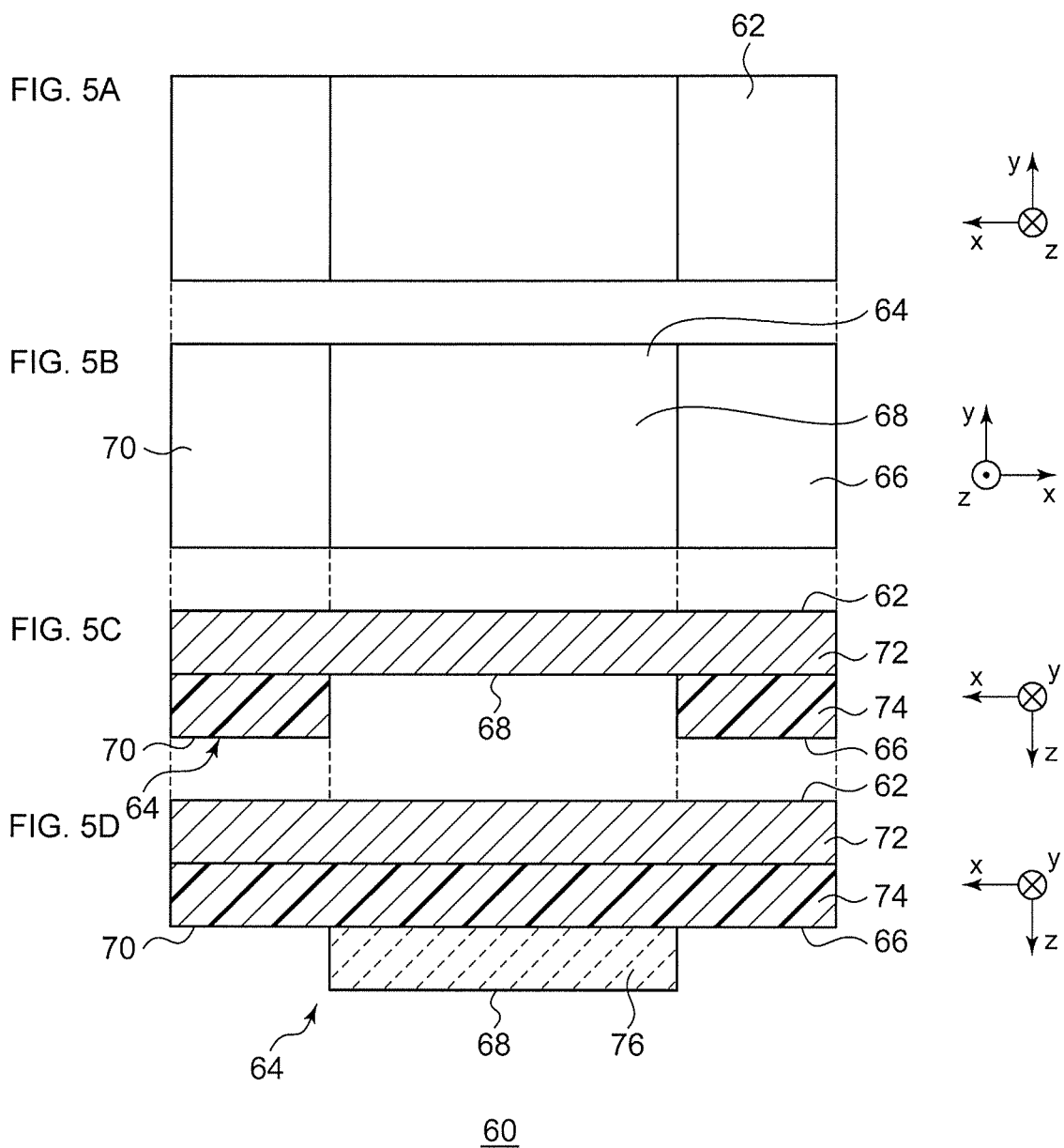

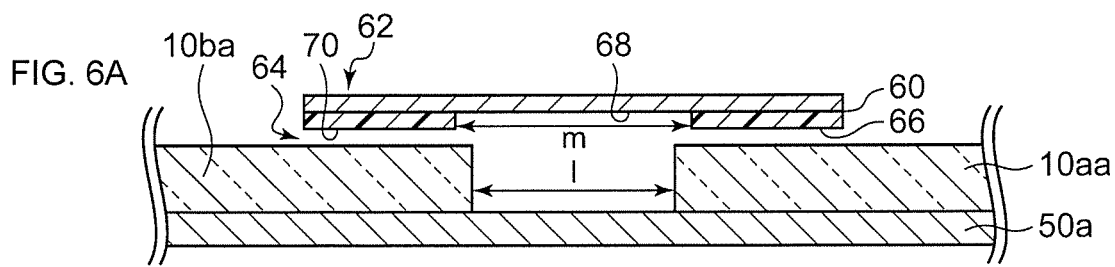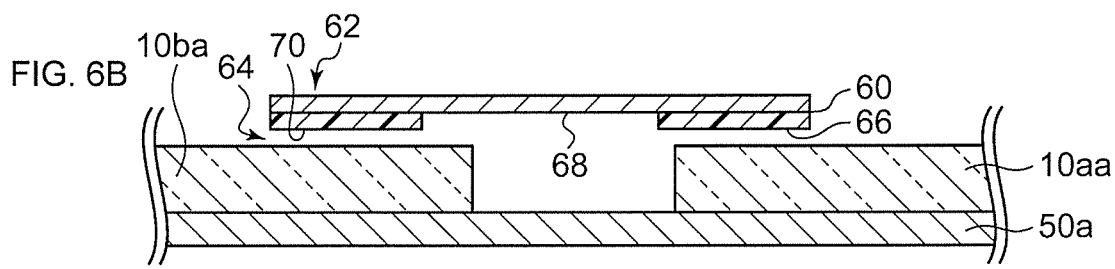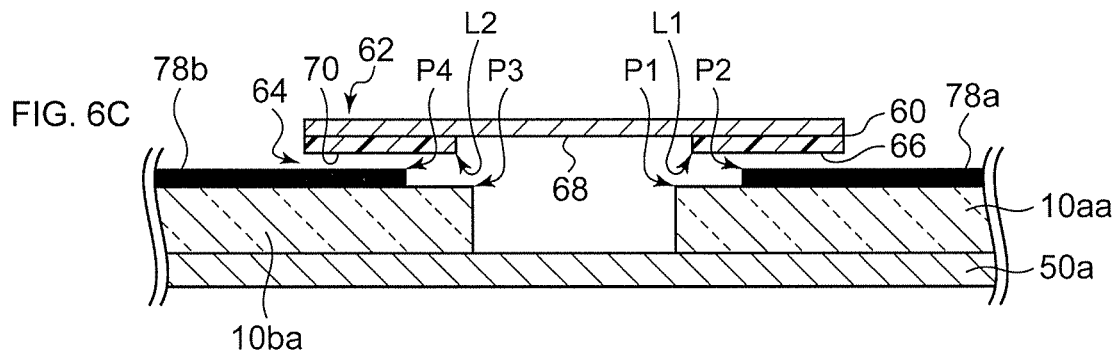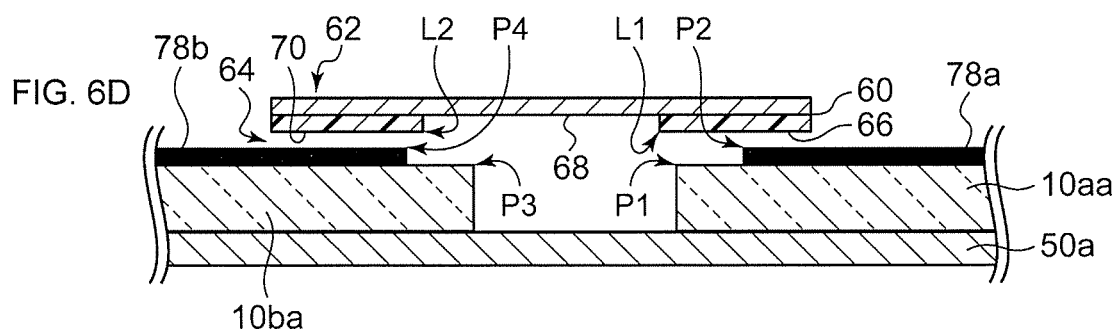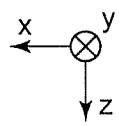

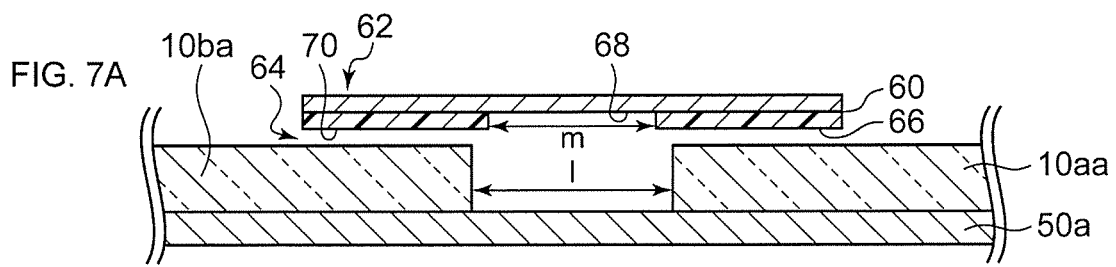
FIG. 7A
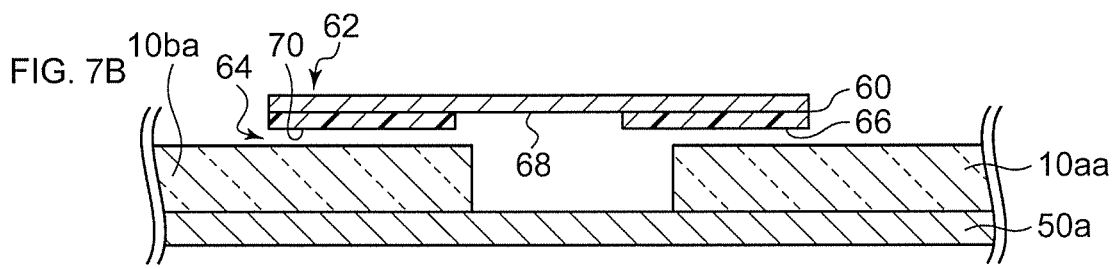
FIG. 7B
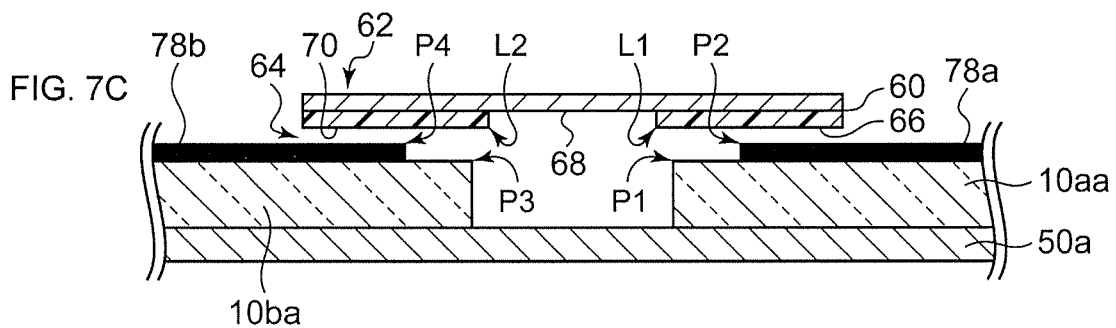
FIG. 7C
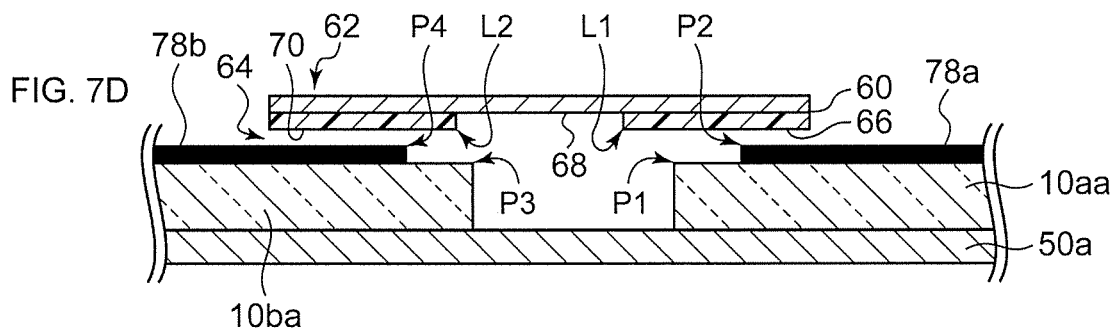
FIG. 7D
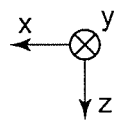

FIG. 8A
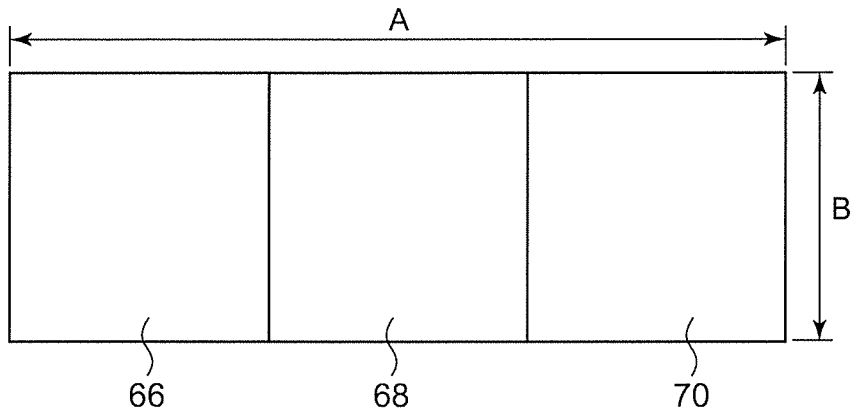
FIG. 8B
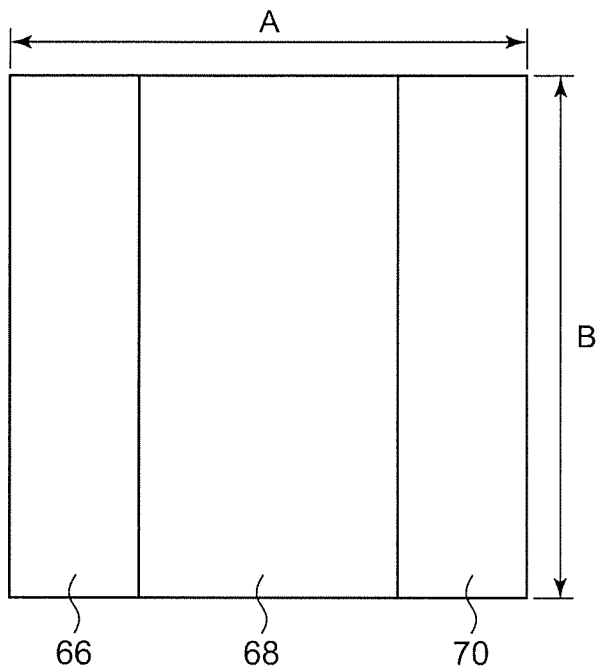
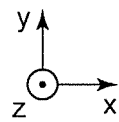

FIG. 9A
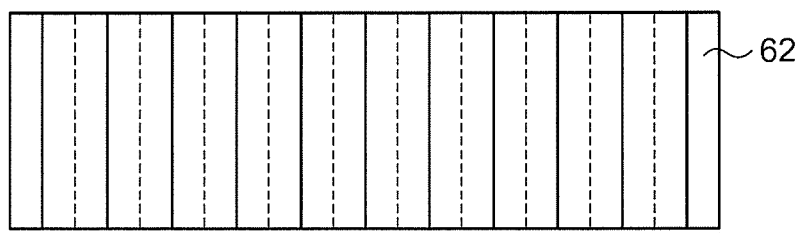
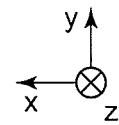
FIG. 9B
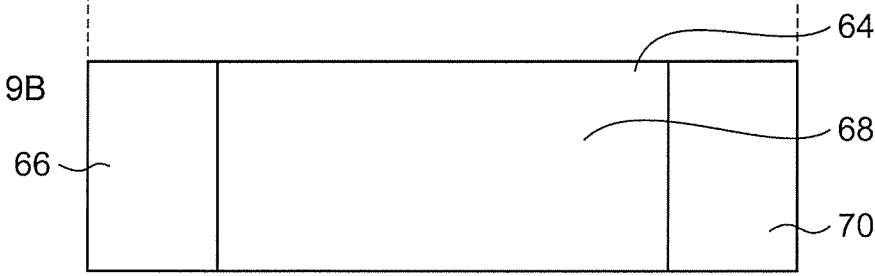
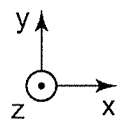
FIG. 9C
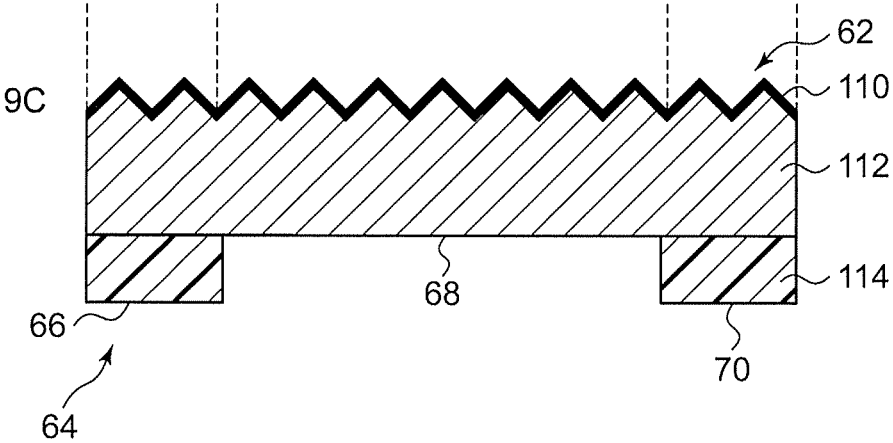
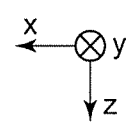

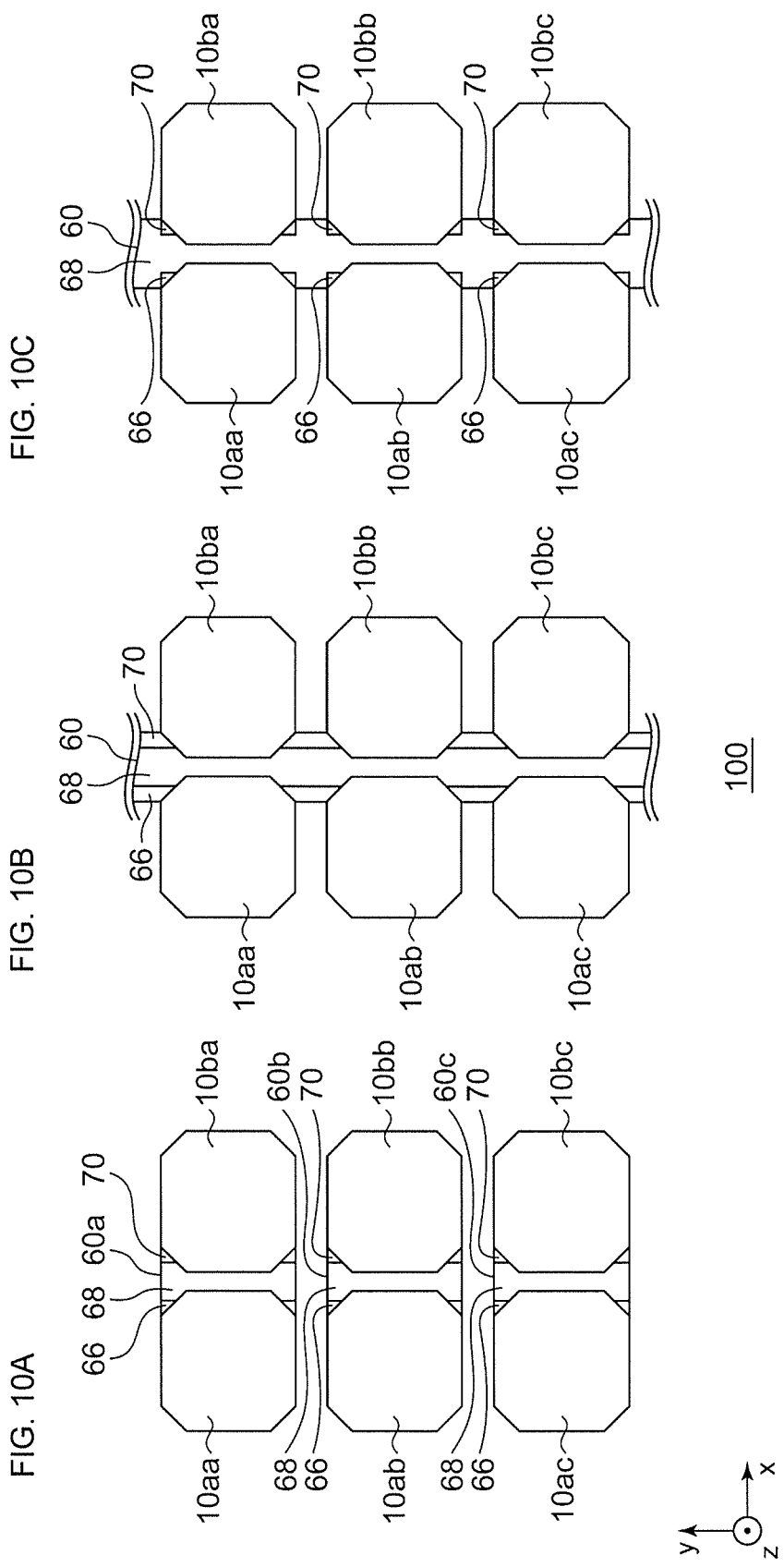

SOLAR CELL MODULE INCLUDING PLURALITY OF SOLAR CELLS

CROSS-REFERENCE TO RELATED APPLICATION

This application is based upon and claims the benefit of priority from the prior Japanese Patent Application No. 2014-265302, filed on Dec. 26, 2014, the entire contents of which are incorporated herein by reference.

BACKGROUND

1. Field

The present disclosure relates to solar cell modules and, in particular, relates to a solar cell module that includes a plurality of solar cells.

2. Description of the Related Art

A solar cell module is formed by sealing solar cells with an encapsulant disposed between a front-surface-side transparent protective member on a light-receiving-surface side and a back-surface-side protective member. Such a solar cell module is manufactured by laminating a front-surface-side transparent protective member, an encapsulant, solar cells, another encapsulant, and a back-surface-side protective member in this order and bonding them together by thermally melting the encapsulants and then curing to cross-link the encapsulants. Prior to this integral bonding process, two solar cells disposed on an encapsulant and a front-surface-side transparent protective member are tentatively fixed by a tentative fixing tape in order to prevent distortion or the like of the solar cells that could arise during lamination and heating processes (see, for example, patent document 1).

[patent document 1] JP2003-324211

A bonding surface of the tentative fixing tape is bonded to two solar cells when the solar cell module is manufactured. Here, the bonding surface of the tentative fixing tape includes a portion that is not bonded to the two solar cells, and such a portion can be bonded to another member such as an encapsulant, a worktable, or a manufacturing apparatus. Such bonding leads to a decrease in the productivity, such as a drop in the yield rate or a fracture of the solar cells.

SUMMARY

The present invention has been made in view of such an issue and is directed to providing a technique for suppressing a decrease in the productivity of a solar cell module.

To address the above issue, a solar cell module according to an aspect of the present invention includes a plurality of solar cells sealed by an encapsulant between a first protective member and a second protective member, and a fixing member that fixes, among the plurality of solar cells, a first solar cell and a second solar cell that are adjacent to each other. The fixing member includes a release surface and a non-release surface that are oriented in opposite directions. The non-release surface has disposed thereon a bonding region having adhesive strength and a non-bonding region different from the bonding region.

BRIEF DESCRIPTION OF THE DRAWINGS

FIGS. 5A to 5D illustrate configurations of a fixing member illustrated in FIG. 4;

FIGS. 6A to 6D are sectional views illustrating configurations for fixing solar cells with the fixing member illustrated in FIG. 5C;

FIGS. 7A to 7D are sectional views illustrating other configurations for fixing solar cells with the fixing member illustrated in FIG. 5C;

FIGS. 8A and 8B are plan views illustrating other configurations of the fixing member illustrated in FIGS. 5A to 5D as viewed from the light-receiving-surface side;

FIGS. 9A to 9C illustrate a configuration of a fixing member according to Example 2 of the present invention;

FIGS. 10A to 10C are plan views illustrating a configuration for fixing solar cells with the fixing member illustrated in FIGS. 9A to 9C as viewed from the light-receiving-surface side;

DETAILED DESCRIPTION

The invention will now be described by reference to the preferred embodiments. This does not intend to limit the scope of the present invention, but to exemplify the invention.

Example 1

Prior to describing the present invention in concrete terms, an overview will be given. Example 1 of the present invention relates to a solar cell module in which a plurality of solar cells are disposed. In a solar cell module, a plurality of solar cells are arrayed in a line to form a string, and a plurality of strings are arrayed in a direction perpendicular to the direction in which the solar cells are arrayed in a line. In the process of manufacturing such a solar cell module, a plurality of strings are arrayed on an encapsulant and are covered by another encapsulant from above, and then the encapsulants are thermally melted and cured to be cross-linked. Solar cells forming a string are connected by a tab wire, and thus the gap between adjacent solar cells is retained even after the thermal melting. Meanwhile, strings are connected only at their two ends, and thus the gap between strings changes through the thermal melting, which can cause distortion.

In order to prevent such a situation, solar cells included in different strings are fixed by a fixing member, such as a tape. This fixing member is coated on one side with an adhesive and bonded to the solar cells with the adhesive. However, a certain portion of the adhesive is not bonded to the solar cells since the solar cells are disposed with a space provided therebetween. As described above, this portion can be bonded to another member such as an encapsulant, a worktable, or a manufacturing apparatus, which leads to a decrease in the productivity. To address this issue, a fixing member according to the present example includes a non-bonding region that is not coated with an adhesive provided between two bonding regions that are coated with an adhesive. The two bonding regions are bonded to two respective solar cells, and the non-bonding region is disposed between the two solar cells.

Figure 1:
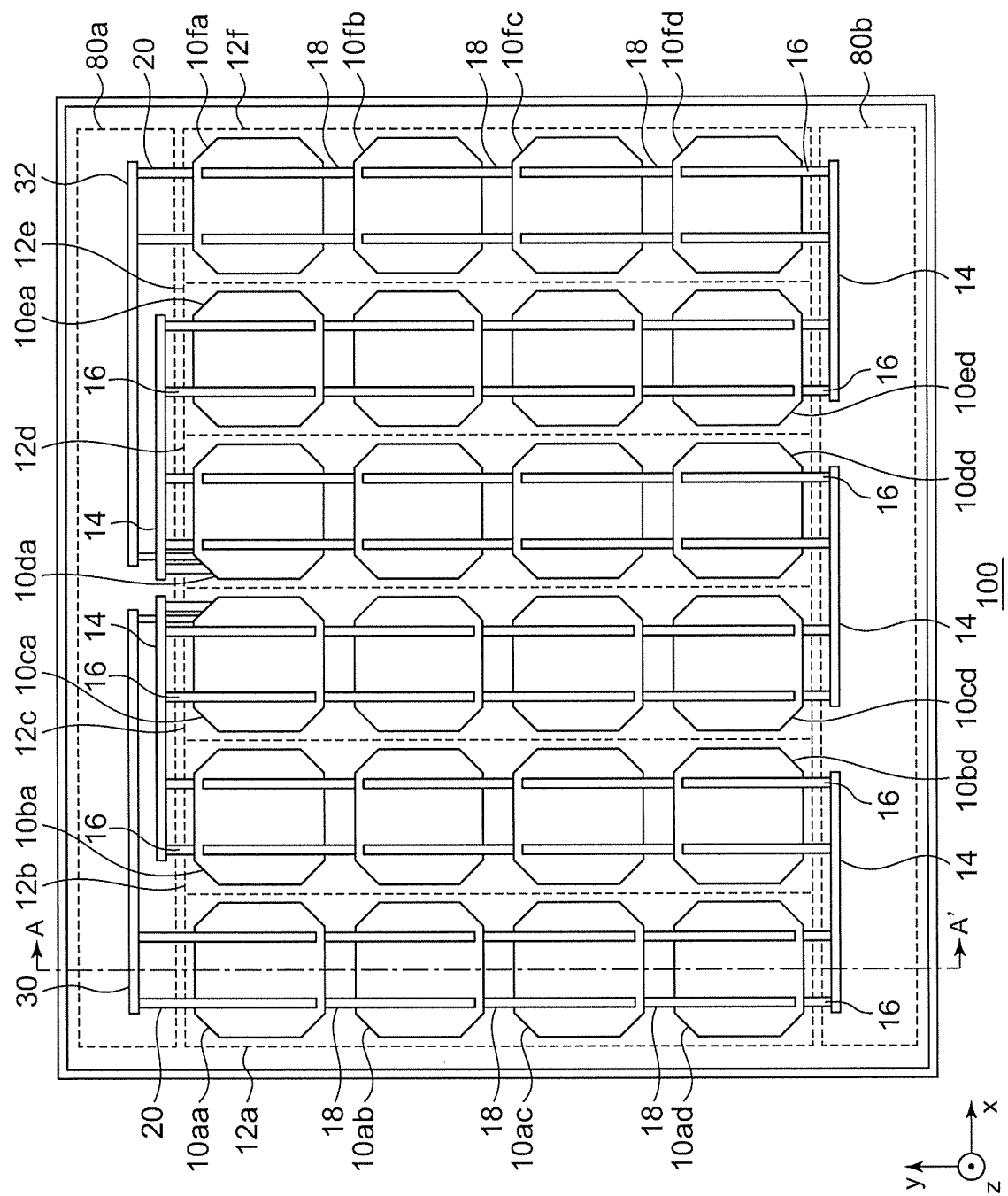
FIG. 1 is a plan view of a solar cell module according to Example 1 of the present invention as viewed from a light-receiving-surface side.
Figure 2:
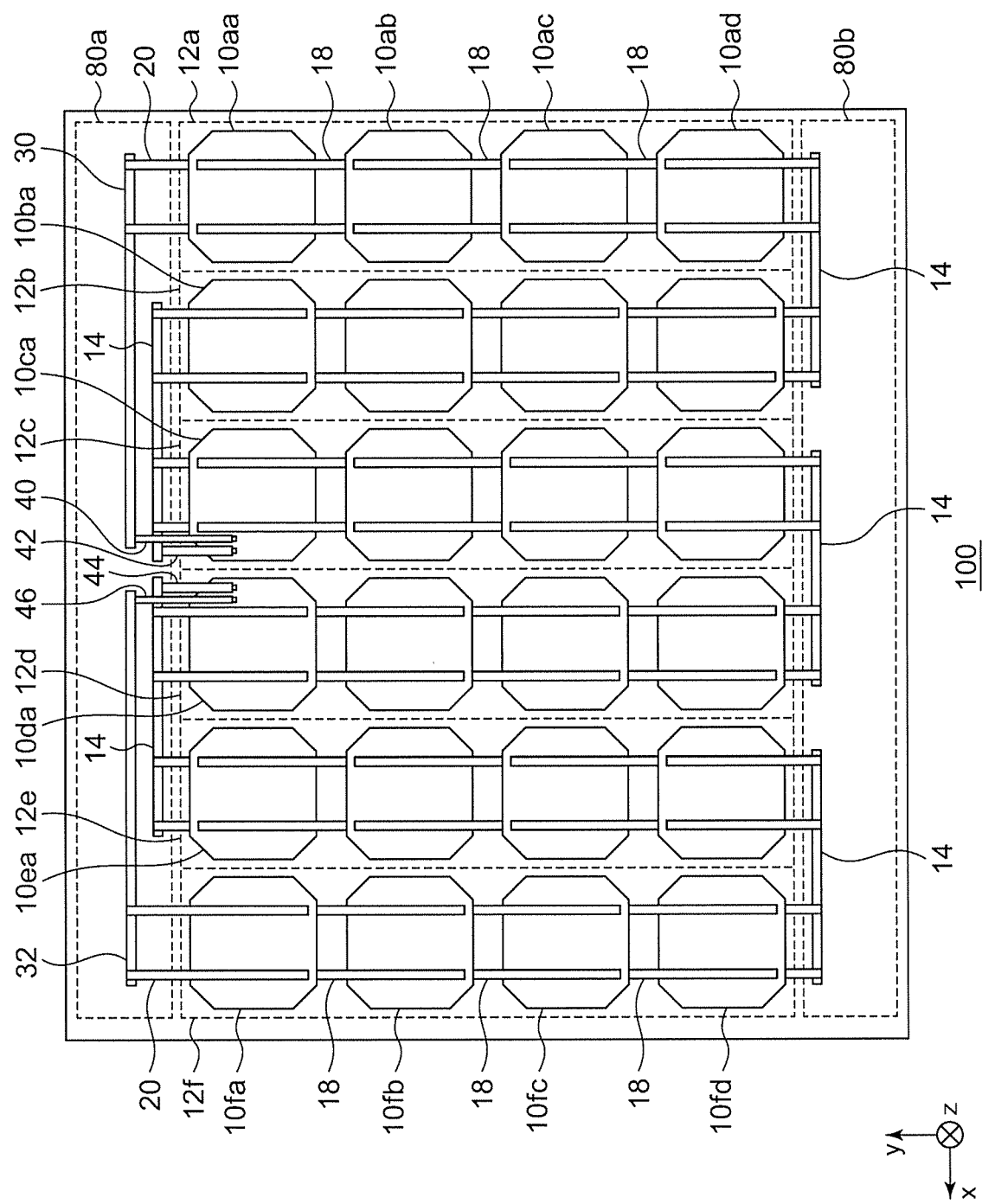
FIG. 2 is a plan view of the solar cell module illustrated in FIG. 1 as viewed from a back-surface side.

FIG. 1 is a plan view of a solar cell module 100 according to Example 1 of the present invention as viewed from the light-receiving-surface side. FIG. 2 is a plan view of the solar cell module 100 as viewed from the back-surface side. As illustrated in FIG. 1, an orthogonal coordinate system composed of an x-axis, a y-axis, and a z-axis is defined. The x-axis and the y-axis are orthogonal to each other within a plane along the solar cell module 100. The z-axis is perpendicular to the x-axis and the y-axis and extends in the thickness direction of the solar cell module 100. The positive directions along the x-axis, the y-axis, and the z-axis are defined as the directions of the arrowheads in FIG. 1, and the negative directions are defined as the directions opposite to those of the arrowheads. Of the two principal surfaces that form the solar cell module 100 and that are parallel to the x-y plane, the principal surface disposed on the side in the positive direction along the z-axis is the light-receiving surface, and the principal surface disposed on the side in the negative direction along the z-axis is the back surface. Hereinafter, the side in the positive direction along the z-axis is referred to as the "light-receiving-surface side," and the side in the negative direction along the z-axis is referred to as the "back-surface side."

The solar cell module 100 includes an eleventh solar cell 10aa, ..., and a sixty-fourth solar cell 10fd, which are collectively referred to as solar cells 10; between-group wiring members 14; group-end wiring members 16; between-cell wiring members 18; conductive members 20; a first extracting wire 30; a second extracting wire 32; a first output wire 40; a second output wire 42; a third output wire 44; and a fourth output wire 46. A first non-power-generating region 80a and a second non-power-generating region 80b are disposed with the plurality of solar cells 10 interposed therebetween in the y-axis direction. Specifically, the first non-power-generating region 80a is disposed on the side of the plurality of solar cells 10 that is in the positive direction along the y-axis, and the second non-power-generating region 80b is disposed on the side of the plurality of solar cells 10 that is in the negative direction along the y-axis. The first non-power-generating region 80a and the second non-power-generating region 80b (hereinafter, also referred to as "the non-power-generating regions 80" collectively) are rectangular in shape and do not include the solar cells 10.

The plurality of solar cells 10 each absorb incident light and generate photoelectromotive force. The solar cells 10 are formed, for example, of a semiconductor material, such as crystalline silicon, gallium arsenide (GaAs), or indium phosphide (InP). The structure of the solar cells 10 is not particularly limited, and herein crystal silicon and amorphous silicon are laminated on each other, for example. Although illustration is omitted in FIGS. 1 and 2, a plurality of finger electrodes extending parallel to each other in the x-axis direction and a plurality of—for example, two—busbar electrodes extending orthogonally to the plurality of finger electrodes in the y-axis direction are provided on the light-receiving surface and the back surface of each of the solar cells 10. The busbar electrodes connect the plurality of finger electrodes.

The plurality of solar cells 10 are arrayed in a matrix in the x-y plane. Herein, six solar cells 10 are arrayed in the x-axis direction, and four solar cells 10 are arrayed in the y-axis direction. Four solar cells 10 arrayed in the y-axis direction are connected in series by the between-cell wiring members 18 to form a single solar cell group 12. The solar cell group 12 corresponds to the string described above. For example, the eleventh solar cell 10aa, the twelfth solar cell 10ab, the thirteenth solar cell 10ac, and the fourteenth solar cell 10ad are connected to form a first solar cell group 12a. Other solar cell groups 12, such as a second solar cell group 12b to a sixth solar cell group 12f, are formed in a similar manner. Consequently, six solar cell groups 12 are arrayed parallel to each other in the x-axis direction.

To form a solar cell group 12, between-cell wiring members 18 connect the busbar electrodes on the light-receiving-surface side of one of the adjacent solar cells 10 to the busbar electrodes on the back-surface side of the other one of the adjacent solar cells 10. For example, two between-cell wiring members 18 for connecting the eleventh solar cell 10aa to the twelfth solar cell 10ab electrically connect the busbar electrodes on the back-surface side of the eleventh solar cell 10aa to the busbar electrodes on the light-receiving-surface side of the twelfth solar cell 10ab.

Two of the five between-group wiring members 14 are disposed in the first non-power-generating region 80a, and the remaining three are disposed in the second non-power-generating region 80b. Each of the five between-group wiring members 14 extends in the x-axis direction and is electrically connected to two mutually adjacent solar cell groups 12 with the group-end wiring members 16 provided therebetween. For example, the fourteenth solar cell 10ad of the first solar cell group 12a that is located on the side toward the second non-power-generating region 80b and the twenty-fourth solar cell 10bd of the second solar cell group 12b that is located on the side toward the second non-power-generating region 80b are electrically connected to the between-group wiring member 14 with the group-end wiring members 16 provided therebetween. Furthermore, the second output wire 42 and the third output wire 44 are electrically connected to the respective between-group wiring members 14 disposed in the first non-power-generating region 80a.

The conductive members 20 are connected to the first solar cell group 12a and the sixth solar cell group 12f, which are located at the two ends in the x-axis direction. The conductive member 20 connected to the first solar cell group 12a extends in the direction from the light-receiving-surface side of the eleventh solar cell 10aa toward the first non-power-generating region 80a. The first extracting wire 30 and the second extracting wire 32, which form a positive and negative pair, are connected to the respective conductive members 20 with a conductive adhesive, such as solder. Thus, the first extracting wire 30 is electrically connected to the first solar cell group 12a with the conductive member 20 provided therebetween, and the second extracting wire 32 is electrically connected to the sixth solar cell group 12f with the conductive member 20 provided therebetween.

The first extracting wire 30 extends in the positive direction along the x-axis from the position at which the first extracting wire 30 is soldered to the conductive member 20. The first output wire 40 is connected to the first extracting wire 30 at an end portion opposite to the position at which the first extracting wire 30 is soldered to the conductive member 20. The second extracting wire 32 extends in the negative direction along the x-axis from the position at which the second extracting wire 32 is soldered to the conductive member 20. The fourth output wire 46 is connected to the second extracting wire 32 at an end portion opposite to the position at which the second extracting wire 32 is soldered to the conductive member 20.

Figure 3:
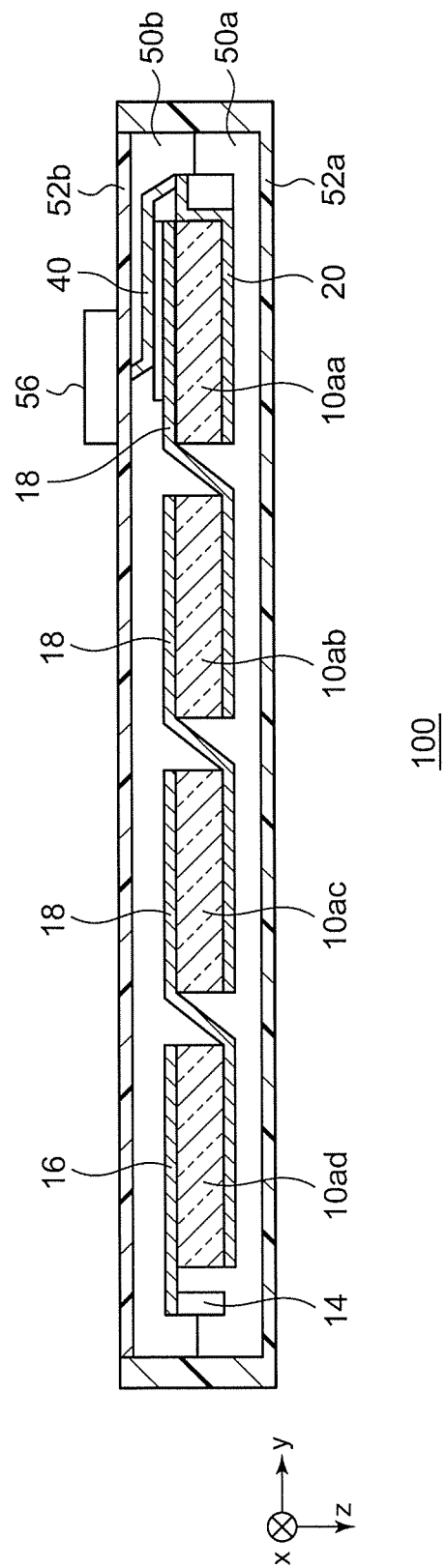
FIG. 3 is a sectional view of the solar cell module illustrated in FIG. 1 taken along a y-axis.

FIG. 3 is a sectional view of the solar cell module 100 taken along the y-axis and is a sectional view along A-A' in FIG. 1. The solar cell module 100 includes the eleventh solar cell 10aa, the twelfth solar cell 10ab, the thirteenth solar cell 10ac, and the fourteenth solar cell 10ad, which are collectively referred to as the solar cells 10; the between-group wiring member 14; the group-end wiring member 16; the between-cell wiring members 18; the conductive member 20; the first output wire 40; a first encapsulant 50a and a second encapsulant 50b, which are collectively referred to as the encapsulants 50; a first protective member 52a and a second protective member 52b, which are collectively referred to as the protective members 52; and a terminal box 56. The upper side in FIG. 3 corresponds to the back-surface side, and the lower side corresponds to the light-receiving-surface side.

The first protective member 52a is disposed on the light-receiving-surface side of the solar cell module 100 to protect the front surface of the solar cell module 100. Translucent, water-impermeable glass, translucent plastics, or the like is used for the first protective member 52a, and the first protective member 52a is formed into a rectangular plate shape. The first encapsulant 50a is laminated on the back-surface side of the first protective member 52a. The first encapsulant 50a is disposed between the first protective member 52a and the solar cells 10 to bond them together. For example, a thermoplastic resin as in a resin film, such as polyolefin, EVA (ethylene-vinyl acetate), PVB (polyvinyl butyral), or polyimide, is used for the first encapsulant 50a. A thermosetting resin may instead be used. The first encapsulant 50a is formed by a rectangular sheet material that is translucent and has a surface with substantially the same dimensions as the first protective member 52a in the x-y plane.

The second encapsulant 50b is laminated on the back-surface side of the first encapsulant 50a. The second encapsulant 50b seals the plurality of solar cells 10, the between-cell wiring members 18, and so on between the second encapsulant 50b and the first encapsulant 50a. A material similar to the material for the first encapsulant 50a can be used for the second encapsulant 50b. The second encapsulant 50b may be integrated with the first encapsulant 50a through heating in a laminate-cure process.

The second protective member 52b is laminated on the back-surface side of the second encapsulant 50b. The second protective member 52b, serving as a back sheet, protects the back-surface side of the solar cell module 100. A resin film such as PET (polyethylene terephthalate), a laminated film having a structure in which an aluminum foil is sandwiched by resin films, or the like is used for the second protective member 52b. An opening (not illustrated) that penetrates in the z-axis direction is provided in the second protective member 52b.

The terminal box 56 is formed into a rectangular parallelepiped shape and is bonded to the back-surface side of the second protective member 52b with the use of an adhesive, such as silicone, so as to cover the opening (not illustrated) in the second protective member 52b. The first and fourth output wires 40 and 46, which form a positive and negative pair, the second output wire 42, and the third output wire 44 are guided to a bypass diode (not illustrated) housed in the terminal box 56. Herein, the terminal box 56 is disposed on the second protective member 52b, for example, at a position that overlaps the thirty-first solar cell 10ca and the forty-first solar cell 10da. An aluminum frame may be attached to surround the solar cell module 100.

Figure 4:
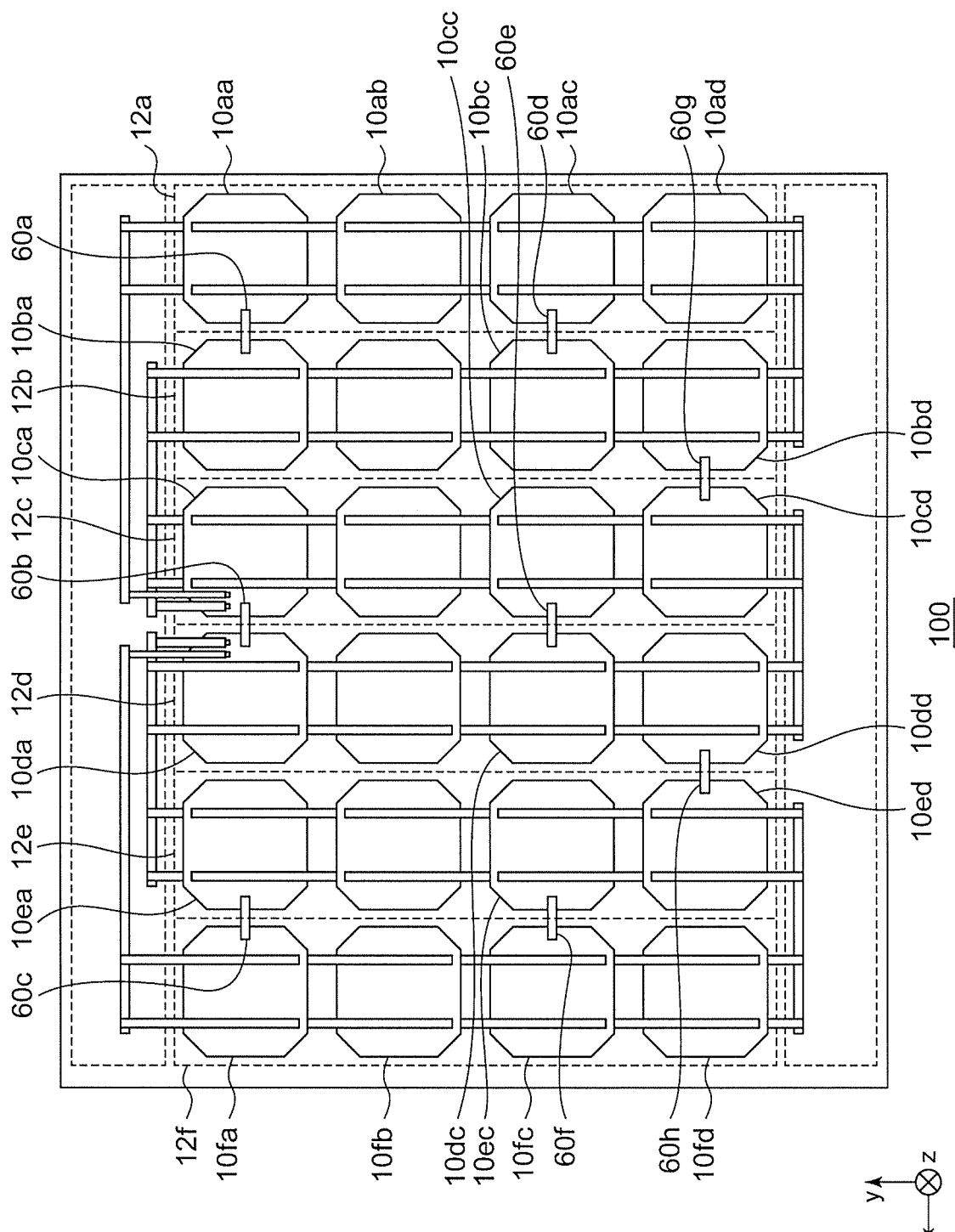
FIG. 4 is another plan view of the solar cell module illustrated in FIG. 1 as viewed from the back-surface side.

Thus far, the fixing member described above has been omitted in order to clearly describe the arrangement of the solar cells 10 and so on. Hereinafter, the fixing member will be described in detail. FIG. 4 is another plan view of the solar cell module 100 as viewed from the back-surface side. FIG. 4 is depicted in a similar manner to FIG. 2 and further includes a first fixing member 60a, a second fixing member 60b, a third fixing member 60c, a fourth fixing member 60d, a fifth fixing member 60e, a sixth fixing member 60f, a seventh fixing member 60g, and an eighth fixing member 60h, which are collectively referred to as the fixing members 60.

The first fixing member 60a fixes together the eleventh solar cell 10aa and the twenty-first solar cell 10ba, which are adjacent to each other in the x-axis direction. Similarly to the first fixing member 60a, the second fixing member 60b to the eighth fixing member 60h each fix together two solar cells 10 that are adjacent to each other in the x-axis direction. Through such fixing, the first fixing member 60a and the fourth fixing member 60d suppress an increase in the gap between the first solar cell group 12a and the second solar cell group 12b, and the seventh fixing member 60g suppresses an increase in the gap between the second solar cell group 12b and the third solar cell group 12c. In addition, the second fixing member 60b and the fifth fixing member 60e suppress an increase in the gap between the third solar cell group 12c and the fourth solar cell group 12d, and the eighth fixing member 60h suppresses an increase in the gap between the fourth solar cell group 12d and the fifth solar cell group 12e. Furthermore, the third fixing member 60c and the sixth fixing member 60f suppress an increase in the gap between the fifth solar cell group 12e and the sixth solar cell group 12f. The fixing members 60 may be disposed at positions other than those illustrated in FIG. 4.

FIGS. 5A to 5D illustrate configurations of the fixing member 60. FIG. 5A is a plan view of the fixing member 60 as viewed from the back-surface side. A release surface 62 is disposed on the back-surface side of the fixing member 60, and the release surface 62 has a rectangular shape. FIG. 5B is a plan view of the fixing member 60 as viewed from the light-receiving-surface side. A non-release surface 64 is disposed on the light-receiving-surface side of the fixing member 60, and thus the non-release surface 64 and the release surface 62 are oriented in opposite directions. A first bonding region 66, a non-bonding region 68, and a second bonding region 70 are disposed on the non-release surface 64. The first bonding region 66 and the second bonding region 70, which are collectively referred to as the bonding regions, have adhesive strength. The non-bonding region 68 is disposed between the first bonding region 66 and the second bonding region 70 on the non-release surface 64 and does not have adhesive strength unlike the bonding regions.

FIG. 5C is a sectional view of the fixing member 60. A film 72 is disposed to extend in the x-axis direction. The film 72 is formed, for example, of a polyester-based resin. The release surface 62 is formed on the back-surface side of the film 72. Two bonding layers 74 are laminated on the light-receiving-surface side of the film 72. The bonding layers 74 are formed, for example, of an acryl-based resin. The first bonding region 66 and the second bonding region 70 are formed on the respective light-receiving-surface sides of the two bonding layers 74, and the non-bonding region 68 is formed on the light-receiving-surface side of the film 72 at a portion in which the bonding layers 74 are not laminated.

FIG. 5D is also a sectional view of the fixing member 60 and illustrates a configuration different from the configuration illustrated in FIG. 5C. Even with the configuration illustrated in FIG. 5D, the plan view as viewed from the back-surface side is as illustrated in FIG. 5A, and the plan view as viewed from the light-receiving-surface side is as illustrated in FIG. 5B. The film 72 is disposed to extend in the x-axis direction. A bonding layer 74 is laminated on the light-receiving-surface side of the film 72. The bonding layer 74 has the shape and size that are similar to those of the film 72 in the x-y plane. A PET 76 is laminated on the light-receiving-surface side of the bonding layer 74 at a center portion in the x-axis direction. The non-bonding region 68 is formed on the light-receiving-surface side of the PET 76. The first bonding region 66 and the second bonding region 70 are formed on the light-receiving-surface side of the bonding layer 74 at portions in which the PET 76 is not laminated.

FIGS. 6A to 6D are sectional views illustrating configurations for fixing solar cells with the fixing member 60 illustrated in FIG. 5C. The upper side in the drawings corresponds to the back-surface side, and the lower side corresponds to the light-receiving-surface side. In FIG. 6A, the solar cells 10—for example, the eleventh solar cell 10aa and the twenty-first solar cell 10ba—are laminated on the back-surface side of the first encapsulant 50a. Herein, the distance between the eleventh solar cell 10aa and the twenty-first solar cell 10ba, which are adjacent to each other, in the x-axis direction is set as a first distance and is indicated by "l" in FIG. 6A.

The fixing member 60 is laminated onto the eleventh solar cell 10aa and the twenty-first solar cell 10ba from the back-surface side. At this point, the non-release surface 64 of the fixing member 60 is oriented toward the solar cells 10. The distance between the first bonding region 66 and the second bonding region 70 in the x-axis direction is set as a second distance and indicated by "m" in FIG. 6A. The second distance can be rephrased as the length of the non-bonding region 68 in the direction identical to the direction of the first distance. In FIGS. 6A to 6D, the first distance "l" is no greater than the second distance "m." The first bonding region 66 is bonded to the eleventh solar cell 10aa, and the second bonding region 70 is bonded to the twenty-first solar cell 10ba.

FIG. 6B illustrates a case in which the fixing member 60 has been shifted in the positive direction along the x-axis relative to the configuration in FIG. 6A when the fixing member 60 is laminated onto the eleventh solar cell 10aa and the twenty-first solar cell 10ba from the back-surface side. Thus, the first bonding region 66 is disposed to extend over to the portion between the eleventh solar cell 10aa and the twenty-first solar cell 10ba. Not the first bonding region 66 but the second bonding region 70 may be disposed to extend over to the portion between the eleventh solar cell 10aa and the twenty-first solar cell 10ba.

In FIG. 6C, a first finger electrode 78a is depicted on the back-surface side of the eleventh solar cell 10aa, and a second finger electrode 78b is depicted on the back-surface side of the twenty-first solar cell 10ba. The first finger electrode 78a and the second finger electrode 78b are collectively referred to as the finger electrodes 78. The finger electrodes 78 are each a rod-shaped electrode disposed along the direction from the eleventh solar cell 10aa toward the twenty-first solar cell 10ba, or in other words, along the x-axis direction. The adhesive strength of the bonding regions with respect to the finger electrodes 78 is generally lower than the adhesive strength of the bonding regions with respect to the front surface of the solar cell 10 excluding the portion where the finger electrodes 78 are provided. Therefore, the bonding regions need to be bonded to the front surfaces of the solar cells 10 excluding the portion where the finger electrodes 78 are provided.

In FIG. 6C, the boundary "L1" between the first bonding region 66 and the non-bonding region 68 is disposed in a portion between an edge portion "P1" of the eleventh solar cell 10aa on the side toward the twenty-first solar cell 10ba and an end portion "P2" of the first finger electrode 78a on the side toward the twenty-first solar cell 10ba. In addition, the boundary "L2" between the second bonding region 70 and the non-bonding region 68 is disposed in a portion between an edge portion "P3" of the twenty-first solar cell 10ba on the side toward the eleventh solar cell 10aa and an end portion "P4" of the second finger electrode 78b on the side toward the eleventh solar cell 10aa.

FIG. 6D illustrates a case in which the fixing member 60 has been shifted in the positive direction along the x-axis relative to the configuration in FIG. 6C when the fixing member 60 is laminated onto the eleventh solar cell 10aa and the twenty-first solar cell 10ba from the back-surface side. Thus, the first bonding region 66 is disposed to extend over to the portion between the eleventh solar cell 10aa and the twenty-first solar cell 10ba. Meanwhile, the boundary "L2" between the second bonding region 70 and the non-bonding region 68 is disposed in a portion between the edge portion "P3" of the twenty-first solar cell 10ba on the side toward the eleventh solar cell 10aa and the end portion "P4" of the second finger electrode 78b on the side toward the eleventh solar cell 10aa.

FIGS. 7A to 7D are sectional views illustrating other configurations for fixing the solar cells with the fixing member 60 illustrated in FIG. 5C. Similarly, the upper side in each of the drawings corresponds to the back-surface side, and the lower side corresponds to the light-receiving-surface side. The configuration in FIG. 7A is similar to that illustrated in FIG. 6A. In this case as well, the distance between the eleventh solar cell 10aa and the twenty-first solar cell 10ba, which are adjacent to each other, in the x-axis direction is set as a first distance "l," and the distance between the first bonding region 66 and the second bonding region 70 in the x-axis direction is set as a second distance "m." In FIGS. 7A to 7D, the first distance "l" is greater than the second distance "m." Thus, the first bonding region 66 and the second bonding region 70 are disposed to extend over to the portion between the eleventh solar cell 10aa and the twenty-first solar cell 10ba.

FIG. 7B illustrates a case in which the fixing member 60 has been shifted in the positive direction along the x-axis relative to the configuration in FIG. 7A when the fixing member 60 is laminated onto the eleventh solar cell 10aa and the twenty-first solar cell 10ba from the back-surface side. Thus, the first bonding region 66 is disposed to extend over to the portion between the eleventh solar cell 10aa and the twenty-first solar cell 10ba. Meanwhile, the second bonding region 70 is disposed so as not to extend over to the portion between the eleventh solar cell 10aa and the twenty-first solar cell 10ba. Not the first bonding region 66 but the second bonding region 70 may be disposed to extend over to the portion between the eleventh solar cell 10aa and the twenty-first solar cell 10ba.

In FIG. 7C, similarly to FIG. 6C, the first finger electrode 78a is depicted on the back-surface side of the eleventh solar cell 10aa, and the second finger electrode 78b is depicted on the back-surface side of the twenty-first solar cell 10ba. In FIG. 7C, the boundary "L1" between the first bonding region 66 and the non-bonding region 68 is disposed at a position further in the positive direction along the x-axis than the edge portion "P1" of the eleventh solar cell 10*aa* on the side toward the twenty-first solar cell 10*ba*. In addition, the boundary "L2" between the second bonding region 70 and the non-bonding region 68 is disposed at a position further in the negative direction along the x-axis than the edge portion "P3" of the twenty-first solar cell 10*ba* on the side toward the eleventh solar cell 10*aa*.

FIG. 7D illustrates a case in which the fixing member 60 has been shifted in the positive direction along the x-axis relative to the configuration in FIG. 7C when the fixing member 60 is laminated onto the eleventh solar cell 10*aa* and the twenty-first solar cell 10*ba* from the back-surface side. Thus, the first bonding region 66 is disposed to extend over to the portion between the eleventh solar cell 10*aa* and the twenty-first solar cell 10*ba*, and the second bonding region 70 is disposed so as not to extend over to the portion between the eleventh solar cell 10*aa* and the twenty-first solar cell 10*ba*. The boundary "L2" between the second bonding region 70 and the non-bonding region 68 is disposed in a portion between the edge portion "P3" of the twenty-first solar cell 10*ba* on the side toward the eleventh solar cell 10*aa* and the end portion "P4" of the second finger electrode 78*b* on the side toward the eleventh solar cell 10*aa*.

FIGS. 8A and 8B are plan views illustrating other configurations of the fixing member 60 as viewed from the light-receiving-surface side. In FIG. 8A, the length "A" in the x-axis direction is greater than the length "B" in the y-axis direction. In contrast, in FIG. 8B, the length "A" in the x-axis direction is no greater than the length "B" in the y-axis direction. The direction of the length "A" and the direction of the length "B" do not need to be orthogonal to each other as in the x-axis and the y-axis and may be non-orthogonal within the margin of error. Herein, the area of the first bonding region 66 in FIG. 8A is equal to the area of the first bonding region 66 in FIG. 8B, and the area of the second bonding region 70 in FIG. 8A is equal to the area of the second bonding region 70 in FIG. 8B.

According to the present example, not only the bonding regions but also the non-bonding region is disposed on the non-release surface of the fixing member, which thus can suppress an occurrence of bonding onto another member such as an encapsulant, a worktable, or a manufacturing apparatus. The non-bonding region is disposed between the first bonding region and the second bonding region, which makes it possible to dispose the non-bonding region between two solar cells. The non-bonding region is disposed between the two solar cells, which can suppress an occurrence of bonding onto another member such as an encapsulant, a worktable, or a manufacturing apparatus. Since an occurrence of such bonding is suppressed, a decrease in the productivity, such as a drop in the yield rate or a fracture of the solar cells can be suppressed. The first distance is no greater than the second distance, which makes it easier to bond the first bonding region and the second bonding region to the respective solar cells.

One of the first bonding region and the second bonding region is disposed to extend over to the portion between the two solar cells, which makes it possible to bond one of the first bonding region and the second bonding region to a portion between the two solar cells. The boundary between the first bonding region and the non-bonding region is disposed in a portion between an edge portion of a solar cell and an end portion of a finger electrode, which can enhance the bonding between the fixing member and the solar cells even in a case in which the finger electrode is provided.

The first distance is greater than the second distance, which makes it possible to bond the first bonding region and the second bonding region onto a portion between the two solar cells. The first bonding region and the second bonding region are disposed to extend over to the portion between the two solar cells, which makes it possible to bond the first bonding region and the second bonding region onto the portion between the two solar cells and to enhance the bonding. The boundary between the first bonding region and the non-bonding region and the boundary between the second bonding region and the non-bonding region are disposed in a portion between edge portions of the respective solar cells and end portions of the respective finger electrodes, which can enhance the bonding between the fixing member and the solar cells even in a case in which the finger electrodes are provided.

The length of the fixing member in the x-axis direction is greater than the length thereof in the y-axis direction, which can reduce the length of the non-bonding region in the y-axis direction. The length of the non-bonding region in the y-axis direction is reduced, which makes it possible to suppress a decrease in the aesthetically pleasing appearance of the solar cell module. The length of the fixing member in the x-axis direction is made no greater than the length thereof in the y-axis direction, which makes it possible to reduce the length of the bonding region in the x-axis direction. The length of the fixing member in the y-axis direction is large, which makes it possible to retain the adhesive strength even if the length of the bonding region in the x-axis direction is reduced.

An overview of the present example is as follows. The solar cell module 100 according to an aspect of the present invention includes the plurality of solar cells 10 sealed by the encapsulants 50 between the first protective member 52*a* and the second protective member 52*b*, and the fixing member 60 that fixes, among the plurality of solar cells 10, a first solar cell 10 and a second solar cell 10 that are adjacent to each other. The fixing member 60 includes the release surface 62 and the non-release surface 64 that are oriented in opposite direction. The non-release surface 64 has disposed thereon the bonding regions having adhesive strength and the non-bonding region 68 different from the bonding regions.

The bonding regions may include the first bonding region 66 and the second bonding region 70. The non-bonding region 68 may be disposed between the first bonding region 66 and the second bonding region 70 on the non-release surface 64.

The first distance between the first solar cell 10 and the second solar cell 10 may be no greater than the second distance of the non-bonding region 68 in the direction identical to the direction of the first distance.

The first distance between the first solar cell 10 and the second solar cell 10 may be greater than the second distance of the non-bonding region 68 in the direction identical to the direction of the first distance.

The first bonding region 66 may be bonded to the first solar cell 10, the second bonding region 70 may be bonded to the second solar cell 10, and one of the first bonding region 66 and the second bonding region 70 may be disposed to extend over to the portion between the first solar cell 10 and the second solar cell 10.

The first bonding region 66 may be bonded to the first solar cell 10, the second bonding region 70 may be bonded to the second solar cell 10, and the first bonding region 66 and the second bonding region 70 may be disposed to extend over to the portion between the first solar cell 10 and the second solar cell 10.

A rod-shaped finger electrode 78 may be disposed on each of the first solar cell 10 and the second solar cell 10 along the direction from the first solar cell 10 toward the second solar cell 10, and the boundary between the first bonding region 66 and the non-bonding region 68 may be disposed in a portion between an edge portion of the first solar cell 10 on the side toward the second solar cell 10 and an end portion of the finger electrode 78 on the first solar cell 10 on the side toward the second solar cell 10.

A rod-shaped finger electrode 78 may be disposed on each of the first solar cell 10 and the second solar cell 10 along the direction from the first solar cell 10 toward the second solar cell 10, the boundary between the first bonding region 66 and the non-bonding region 68 may be disposed in a portion between an edge portion of the first solar cell 10 on the side toward the second solar cell 10 and an end portion of the finger electrode 78 on the first solar cell 10 on the side toward the second solar cell 10, and the boundary between the second bonding region 70 and the non-bonding region 68 may be disposed in a portion between an edge portion of the second solar cell 10 on the side toward the first solar cell 10 and an end portion of the finger electrode 78 on the second solar cell 10 on the side toward the first solar cell 10.

The length of the fixing member 60 in the first direction from the first solar cell 10 toward the second solar cell 10 may be greater than the length of the fixing member 60 in the second direction that is substantially perpendicular to the first direction.

The length of the fixing member 60 in the first direction from the first solar cell 10 toward the second solar cell 10 may be no greater than the length of the fixing member 60 in the second direction that is substantially perpendicular to the first direction.

Example 2

Next, Example 2 will be described. Similarly to Example 1, Example 2 relates to a fixing member for fixing together solar cells included in separate strings. In Example 1, a tape has been illustrated as the fixing member. Meanwhile, the fixing member in Example 2 is a diffusing member. A diffusing member is a member that diffuses light such that light that is incident on a solar cell module but is not incident on solar cells is made to be incident on the solar cells. Similarly to the fixing member of Example 1, the diffusing member includes a release surface and a non-release surface. The non-release surface of the diffusing member is formed in a similar manner to that of Example 1, but the release surface has a configuration for diffusing light. Similarly to the fixing member of Example 1, such a diffusing member fixes together the solar cells, and thus the non-release surface faces an issue similar to that of Example 1. A solar cell module 100 according to Example 2 is of the same type as the one illustrated in FIGS. 1, 2, and 3. Herein, the description centers on the differences.

FIGS. 9A to 9C illustrate a configuration of a fixing member 60 according to Example 2 of the present invention. FIG. 9A is a plan view of the fixing member 60 as viewed from the back-surface side. A release surface 62 is disposed on the back-surface side of the fixing member 60, and the release surface 62 has a rectangular shape. Similarly to FIG. 5B, FIG. 9B is a plan view of the fixing member 60 as viewed from the light-receiving-surface side.

FIG. 9C is a sectional view of the fixing member 60. A PET 112 is disposed to extend in the x-axis direction. In place of the PET 112, another material such as an acrylic resin or a mixture of the PET 112 and an acrylic resin may also be used. The surface on the back-surface side of the PET 112 corresponds to the release surface 62 and has a rugged shape. The projection portion of the rugged shape has a mountain-like shape of a substantially triangular prism shape. A metal layer 110 having a shape that matches the rugged shape is laminated on the back-surface side of the PET 112. Thus, the metal layer 110 also has a rugged shape, which thus causes light to be diffused. Therefore, the metal layer 110 corresponds to a reflector. Herein, the metal layer 110 corresponds to the release surface 62. Two bonding layers 114 are laminated on the light-receiving-surface side of the PET 112. The bonding layers 114 are formed, for example, of an acryl-based resin. The bonding layers 114 may instead be formed of a material other than an acryl-based resin, such as EVA. A first bonding region 66 and a second bonding region 70 are formed on the respective light-receiving-surface sides of the two bonding layers 114, and a non-bonding region 68 is formed on the light-receiving-surface side of the PET 112 at a portion in which the bonding layers 114 are not laminated.

FIGS. 10A to 10C are plan views illustrating configurations for fixing solar cells with the fixing member 60 illustrated in FIGS. 9A to 9C as viewed from the light-receiving-surface side. In FIG. 10A, a first fixing member 60a is disposed between the eleventh solar cell 10aa and the twenty-first solar cell 10ba. Specifically, the first bonding region 66 of the first fixing member 60a is bonded to the back-surface side of the eleventh solar cell 10aa, and the second bonding region 70 of the first fixing member 60a is bonded to the back-surface side of the twenty-first solar cell 10ba. In addition, the non-bonding region 68 of the first fixing member 60a is located between the eleventh solar cell 10aa and the twenty-first solar cell 10ba. A second fixing member 60b and a third fixing member 60c are disposed in a similar manner.

The fixing member 60 in FIG. 10B is formed to have a greater length in the y-axis direction than the first fixing member 60a and so on illustrated in FIG. 10A. Such a configuration similarly applies to the fixing member 60 illustrated in FIG. 10C. In the fixing member 60 illustrated in FIG. 10C, the non-bonding region 68 is also disposed between the eleventh solar cell 10aa and the twelfth solar cell 10ab, which are adjacent to each other in the y-axis direction.

Figure 11:
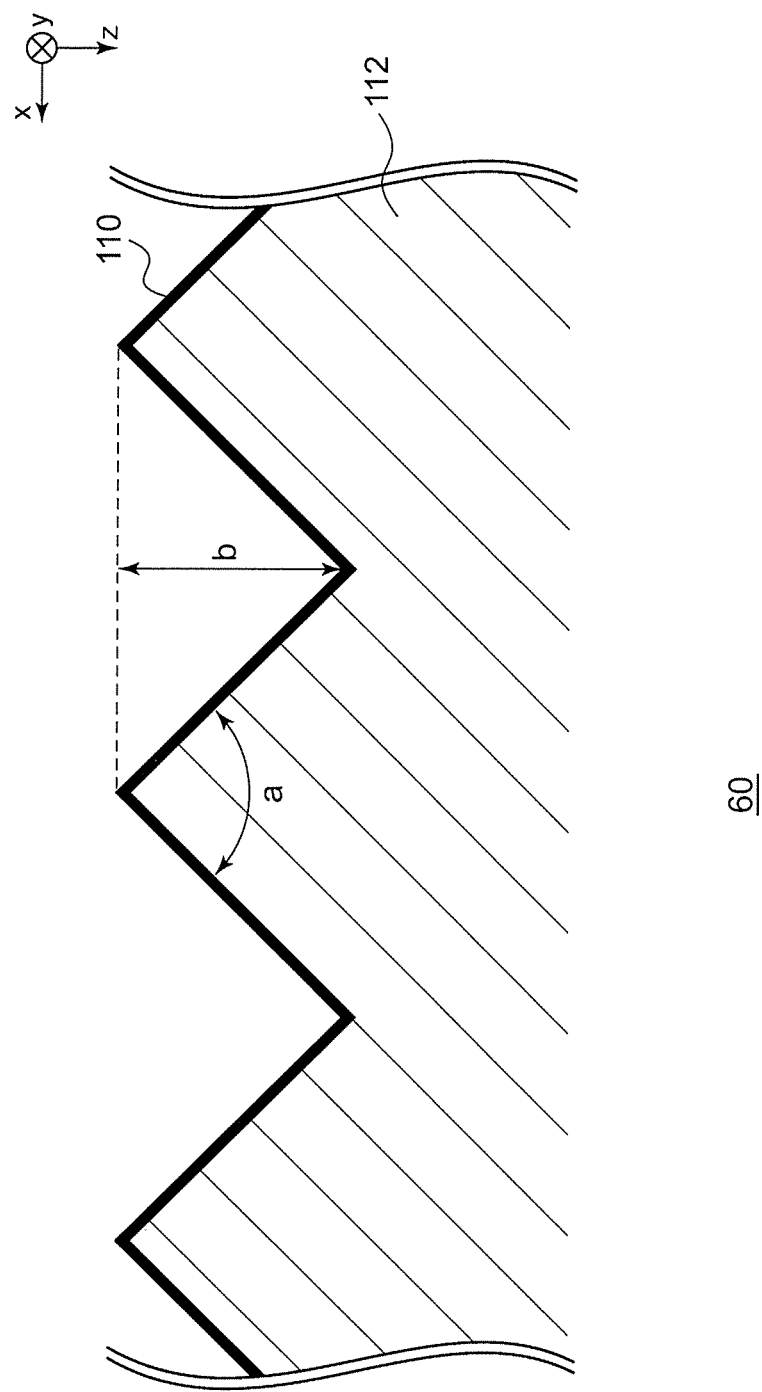
FIG. 11 is a sectional view illustrating a portion of the fixing member illustrated in FIG. 9C.

FIG. 11 is a sectional view illustrating a portion of the fixing member 60. This is an enlarged view of the vicinity of the metal layer 110 illustrated in FIG. 9C. As illustrated, the rugged shape of the release surface 62 is formed into a ramp wave shape along a section from the release surface 62 toward the non-release surface 64. The projection portion in the ramp wave shape has a divergent angle "a" of 90 degrees to 150 degrees. The height "b" from the recess portion to the projection portion of the rugged shape of the release surface 62 is from 3 μm to 60 μm.

Figure 12A:
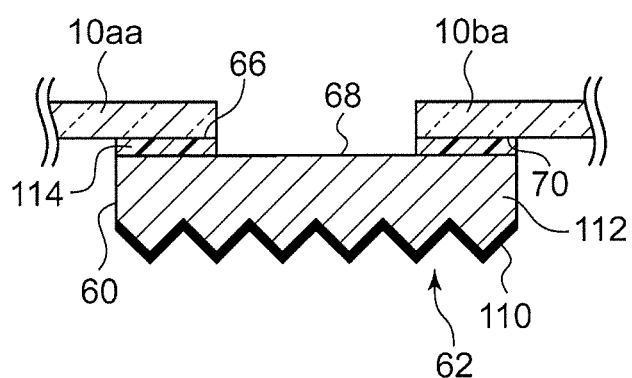
FIGS. 12A to 12C are sectional views illustrating configurations for fixing solar cells with the fixing member illustrated in FIG. 9C.
Figure 12B:
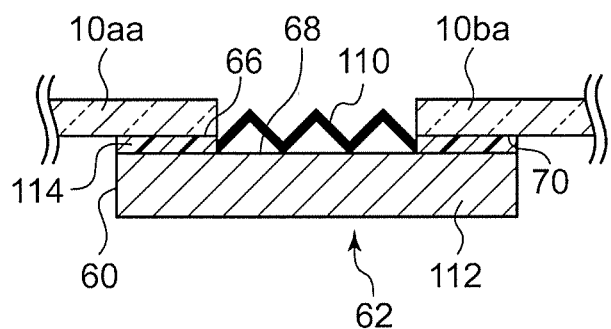
Figure 12C:
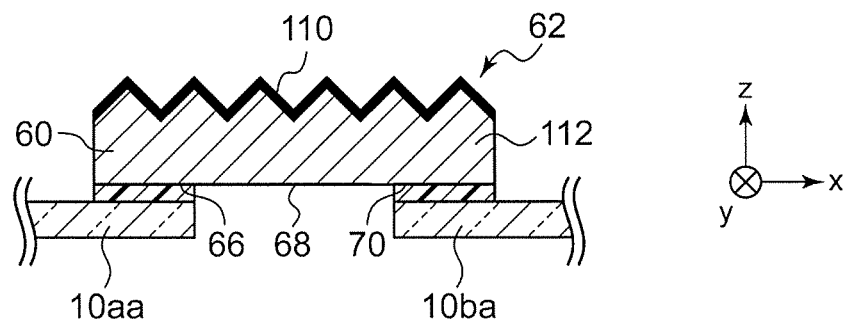

FIGS. 12A to 12C are sectional views illustrating configurations for fixing the solar cells 10 with the fixing member 60. In these drawings, the upper side corresponds to the light-receiving-surface side. In FIG. 12A, as described thus far, the fixing member 60 is attached such that the release surface 62 is oriented toward the back-surface side of the solar cell module 100. Thus, the metal layer 110 is oriented toward the back-surface side. In FIG. 12B, similarly to FIG. 12A, the fixing member 60 is attached such that the release surface 62 is oriented toward the back-surface side of the solar cell module 100. However, in FIG. 12B, the metal layer 110 is not disposed on the release surface 62, and the metal layer 110 is disposed in the non-bonding region 68. Thus, the metal layer 110 is oriented toward the light-receiving-surface side. In FIG. 12C, the fixing member 60 is attached such that the release surface 62 is oriented toward the light-receiving-surface side of the solar cell module 100. Thus, the metal layer 110 is oriented toward the light-receiving-surface side.

According to the present example, the rugged shape is disposed on the release surface, which makes it possible to use the diffusing member as the fixing member. The solar cell module includes the diffusing member, which can improve the power generation efficiency of the solar cell module. Not only the bonding regions but also the non-bonding region is disposed on the non-release surface of the diffusing member, which can suppress an occurrence of bonding onto another member such as an encapsulant, a worktable, or a manufacturing apparatus. Since an occurrence of such bonding is suppressed, a decrease in the productivity, such as a drop in the yield rate or a fracture of the solar cells can be suppressed.

Thus far, the present invention has been described on the basis of an example. This example is illustrative in nature, and it should be appreciated by a person skilled in the art that various modifications can be made to the combinations of the components and the processing processes and that such modifications also fall within the scope of the present invention.

An overview of the present example is as follows. The release surface 62 may have a rugged shape.

The rugged shape of the release surface 62 may be formed into a ramp wave shape along a section from the release surface 62 toward the non-release surface 64, and the projection portion of this ramp wave shape may have a divergent angle of 90 degrees to 150 degrees.

The height from the recess portion to the projection portion of the rugged shape of the release surface 62 may be from 3 μm to 60 μm.

The fixing member 60 may be attached such that the release surface 62 is oriented toward the back-surface side of the solar cell module 100.

The fixing member 60 may be attached such that the release surface 62 is oriented toward the light-receiving-surface side of the solar cell module 100.

The metal layer 110 having a rugged shape may be attached to the non-bonding region 68.

In Examples 1 and 2 of the present invention, two bonding regions and one non-bonding region 68 are formed on the non-release surface 64. This, however, is not a limiting example, and the number of bonding regions does not need to be two, and the number of non-bonding regions 68 does not need to be one, for example. When the number of bonding regions is "N" (N is an integer no less than 2), the number of non-bonding regions 68 is "N−1." In addition, the bonding region and the non-bonding region 68 are disposed in an alternating manner. According to this modification, the degree of freedom in the configuration can be improved.

While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A solar cell module, comprising:
   a plurality of solar cells sealed by an encapsulant between a first protective member and a second protective member; and
   a fixing member that fixes, among the plurality of solar cells, a first solar cell and a second solar cell that are adjacent to each other, wherein
   the fixing member includes a release surface and a non-release surface that are oriented in opposite directions,
   the non-release surface having disposed thereon a bonding region having adhesive strength and a non-bonding region having no adhesive strength,
   the non-bonding region is a different region from the bonding region,
   the first solar cell and the second solar cell adjacent to each other are fixed by the fixing member,
   the plurality of solar cells are two-dimensionally arrayed in a first direction and a second direction perpendicular to the first direction so as to have rows and columns,
   the first solar cell is included in a first row and the second solar cell is included in a second row adjacent to the first row in the second direction, and
   the fixing member is a continuous member that fixes solar cells in the first row and solar cells in the second row along the first direction.

2. The solar cell module according to claim 1, wherein
   the bonding region includes a first bonding region and a second bonding region, and
   the non-bonding region is disposed between the first bonding region and the second bonding region on the non-release surface.

3. The solar cell module according to claim 2, wherein
   a first distance between the first solar cell and the second solar cell is greater than a second distance of the non-bonding region in a direction identical to a direction of the first distance.

4. The solar cell module according to claim 2, wherein
   a rod-shaped electrode is disposed on each of the first solar cell and the second solar cell along a direction from the first solar cell toward the second solar cell, and
   a boundary between the first bonding region and the non-bonding region is disposed in a portion between an edge portion of the first solar cell on a side toward the second solar cell and an end portion of the electrode on the first solar cell on a side toward the second solar cell.

5. The solar cell module according to claim 1, wherein
   the release surface has a rugged shape.

6. The solar cell module according to claim 5, wherein
   the rugged shape of the release surface is formed into a ramp wave shape along a section from the release surface toward the non-release surface, and
   a projection portion of the ramp wave shape has a divergent angle of 90 degrees to 150 degrees.

7. The solar cell module according to claim 5, wherein
   the fixing member is attached such that the release surface is oriented toward a back-surface side of the solar cell module.

8. The solar cell module according to claim 1, wherein
   a length of the fixing member in a first direction from the first solar cell toward the second solar cell is no greater than a length of the fixing member in a second direction substantially perpendicular to the first direction.

9. The solar cell module according to claim 1, wherein
   the fixing member is formed by a polyester-based resin.

10. The solar cell module according to claim 1, wherein the fixing member is formed by PET or an acrylic resin.

11. The solar cell module according to claim 1, wherein the bonding region is formed by an acrylic resin.

12. The solar cell module according to claim 1, wherein:
a first group of solar cells of the plurality of solar cells are arranged in a first direction and electrically connected to each other with a plurality of wiring members, respectively,
the first group of solar cells include the first solar cell,
a second group of solar cells of the plurality of solar cells are arranged in the first direction and electrically connected to each other with a plurality of wiring members, respectively, and
the second group of solar cells include the second solar cell.

13. The solar cell module according to claim 1, wherein:
the fixing member comprises a film, and
an adhesive layer is disposed on the bonding region, and no adhesive is disposed on the non-bonding region.

14. A solar cell module, comprising:
a first cell string including a plurality of first solar cells which are arranged in a first direction and electrically connected with a plurality of wiring members;
a second cell string including a plurality of second solar cells which are arranged in the first direction and electrically connected with a plurality of wiring members;
a first fixing member fixing the plurality of first solar cells and the plurality of second solar cells;
a first protective member;
a second protective member; and
an encapsulant, wherein:
the first cell string, the second cell string and the first fixing member are sealed by the encapsulant between the first protective member and the second protective member,
the fixing member includes a first surface and a second surface opposite to the first surface,
the first surface of the first fixing member has a bonding region having adhesive strength,
the first fixing member is continuously arranged over the plurality of first solar cells and the plurality of second solar cells,
the bonding region of the first fixing member is bonded over the plurality of first solar cells and the plurality of second solar cells,
the first surface has a non-bonding region having no adhesive strength,
the bonding region includes a first bonding region and a second bonding region, the first bonding region bonded to the plurality of first solar cells and the second bonding region bonded to the plurality of second solar cells, and
the non-bonding region is disposed between the first bonding region and the second bonding region on the first surface.

15. A solar cell module, comprising:
a first cell string including a plurality of first solar cells which are arranged in a first direction and electrically connected with a plurality of wiring members;
a second cell string including a plurality of second solar cells which are arranged in the first direction and electrically connected with a plurality of wiring members;
a first fixing member fixing the plurality of first solar cells and the plurality of second solar cells;
a first protective member;
a second protective member; and
an encapsulant, wherein:
the first cell string, the second cell string and the first fixing member are sealed by the encapsulant between the first protective member and the second protective member,
the fixing member includes a first surface and a second surface opposite to the first surface,
the first surface of the first fixing member has a bonding region having adhesive strength,
the first fixing member is continuously arranged over the plurality of first solar cells and the plurality of second solar cells,
the bonding region of the first fixing member is bonded over the plurality of first solar cells and the plurality of second solar cells,
a length of the fixing member in the first direction is greater than a length of the fixing member in a second direction perpendicular to the first direction,
the solar cell module further comprises:
a third cell string including a plurality of third solar cells which are arranged in the first direction and electrically connected with a plurality of wiring members;
a fourth cell string including a plurality of fourth solar cells which are arranged in the first direction and electrically connected with a plurality of wiring members; and
a second fixing member fixing the plurality of third solar cells and the plurality of fourth solar cells,
the first cell string is adjacent to the second cell string in the second direction,
the third cell string is adjacent to the fourth cell string in the second direction,
the third cell string, the fourth cell string and the second fixing member are sealed by the encapsulant between the first protective member and the second protective member,
the second fixing member includes a first surface and a second surface opposite to the first surface,
the first surface of the second fixing member has a bonding region having adhesive strength,
the second fixing member is continuously arranged over the plurality of third solar cells and the plurality of fourth solar cells,
the bonding region of the second fixing member is bonded over the plurality of third solar cells and the plurality of fourth solar cells, and
a length of the second fixing member in the first direction is greater than a length of the second fixing member in the second direction.

16. The solar cell module according to claim 14, wherein:
the bonding region is disposed between two of the plurality of first solar cells which are adjacent to each other in the first direction, and
the bonding region is disposed between two of the plurality of second solar cells which are adjacent to each other in the first direction.

* * * * *